US012261061B2

(12) United States Patent
Yoshida et al.

(10) Patent No.: US 12,261,061 B2
(45) Date of Patent: Mar. 25, 2025

(54) OPTICAL HEATING APPARATUS WITH ANGLED LIGHT HOLDING SUBSTRATE AND HEATING TREATMENT METHOD THEREOF

(71) Applicant: Ushio Denki Kabushiki Kaisha, Tokyo (JP)

(72) Inventors: Tomonori Yoshida, Tokyo (JP); Takahiro Inoue, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 327 days.

(21) Appl. No.: 17/827,876

(22) Filed: May 30, 2022

(65) Prior Publication Data

US 2023/0107581 A1   Apr. 6, 2023

(30) Foreign Application Priority Data

Oct. 6, 2021   (JP) ................. 2021-164518

(51) Int. Cl.
*H01L 21/67* (2006.01)
*H01L 21/66* (2006.01)
*H05B 3/00* (2006.01)

(52) U.S. Cl.
CPC ........ *H01L 21/67115* (2013.01); *H01L 22/12* (2013.01); *H05B 3/0047* (2013.01)

(58) Field of Classification Search
CPC ............... H01L 21/67115; H01L 22/12; H01L 21/6875; H01L 21/324; H05B 3/0047
See application file for complete search history.

(56) References Cited

U.S. PATENT DOCUMENTS

| 2010/0090130 A1* | 4/2010 | Ganapathisubramanian ............... G03F 9/7042 250/492.1 |
| 2012/0113640 A1* | 5/2012 | Markle ................... F21V 14/02 362/249.02 |
| 2019/0318946 A1* | 10/2019 | Kim .................. H01L 21/67115 |
| 2020/0013645 A1 | 1/2020 | Gouda |

FOREIGN PATENT DOCUMENTS

JP   2020-9927 A   1/2020

\* cited by examiner

*Primary Examiner* — John P. Dulka
(74) *Attorney, Agent, or Firm* — Yoshida & Associates LLC; Kenichiro Yoshida

(57) ABSTRACT

An optical heating apparatus includes a supporter on which a workpiece is placed and a plurality of light source units each including an LED substrate on which multiple LED elements are mounted. A first main surface of the LED substrate fails to be parallel to a second main surface of the workpiece. Each of the light source units is arranged to satisfy the following formula: $2\tan 2\theta/\cos\theta \geq D2/D1$, where $\theta$ is an angle formed by the first main surface and the second main surface, D1 is a separation distance between a first LED element and the workpiece, D2 is a separation distance between the first LED element and a second LED element, the first LED element being closest to the second main surface in a normal direction thereof, and the second LED element being farthest to the second main surface in the normal direction thereof.

12 Claims, 3 Drawing Sheets

OPTICAL HEATING APPARATUS WITH ANGLED LIGHT HOLDING SUBSTRATE AND HEATING TREATMENT METHOD THEREOF

CROSS-REFERENCE TO RELATED APPLICATION(S)

This application claims priority from Japanese Patent Application No. 2021-164518. The entire teachings of the above application are incorporated herein by reference.

TECHNICAL FIELD

The present invention relates to an optical heating apparatus and a heating treatment method.

BACKGROUND ART

Semiconductor manufacturing process involves various heating treatments including film forming treatment, oxidation diffusion treatment, modification treatment, and annealing treatment on workpieces, such as semiconductor wafers. These treatments often use a heating treatment method with optical irradiation that enables a non-contact treatment.

For performing the heating treatment of workpieces, an apparatus is known to be provided with lamps such as halogen lamps and solid-state light sources such as LEDs, and to irradiate workpieces with its light for heating. Patent Document 1, for example, discloses a wafer heating unit in which a plurality of LEDs are mounted.
Patent Document 1: JP-A-2020-009927

SUMMARY OF THE INVENTION

Workpieces subjected to heating treatment with light irradiation include semiconductor wafers and glass substrates. When irradiated with light emitted from a light source for heating, these workpieces absorb part of the light, generating heat. The workpieces are subjected to heating treatment with the generated light.

However, most objects do not absorb all of the irradiated light; they absorb a part of the light and reflect the other part of the light. For this reason, the workpiece that is to be subjected to heating treatment absorbs a part of the irradiated light and reflects the other part of the irradiated light.

The above-mentioned Patent Document 1 discloses a heating apparatus that is configured to allow the first main surface on which the LED of the substrate constituting the LED lamp for heating are mounted to be parallel to the second main surface that is the main surface of the workpiece onto which the light for heating is irradiated, in the heating chamber.

In the configuration of the heating apparatus, the light emitted from the LED elements travels toward the second main surface of the workpiece. When the light reaches the second main surface of the workpiece, a part of the light is absorbed by the workpiece and the other part of the light is reflected on the second main surface to travel toward the LED elements.

When the light reflected on the second main surface reaches the LED elements or the vicinity thereof, a part of the light is absorbed by the LED elements or the substrate on which the LED elements are mounted. Hence, the LED elements or the substrate is heated in response to the energy of the absorbed light.

In a heating apparatus that performs heating treatment on a workpiece, hundreds to thousands of LED elements are mounted to raise the temperature of the workpiece to several hundred degrees Celsius. Even when the light source section is composed of a combination of a plurality of light source units, in many cases, several tens to several hundreds of LEDs are densely arranged to be mounted in a single light source unit to perform the heating treatment on the workpiece more efficiently. Hence, even the light reflected from the second main surface of the workpiece and returning to the light source unit, when viewed as a whole, may have energy sufficiently enough to heat the LED elements mounted in the light source unit to several hundred degrees Celsius. Such excessive heating causes a significant decrease in the emission efficiency of the LED elements in the light source unit, the shortening of the service life of the LED elements, and even damage to the LED elements themselves.

In addition, LED elements are often bonded to the substrate with solder, silver paste or the like. Hence, if the LED elements are heated to temperatures that reach the melting temperature of the solder or silver paste, there may occur a defect that the LED elements may be detached from the substrate and fall off. Both of these occurrences are major problems from a viewpoint of the reliability of the heating apparatus.

In view of the above issues, it is an object of the present invention to provide an optical heating apparatus and a heating treatment method with improved reliability by suppressing the LED elements that is a light source for heating from being heated.

An optical heating apparatus according to the present invention is an optical heating apparatus that performs heating treatment to a workpiece by irradiating the workpiece with light includes:
- a supporter on which the workpiece is placed; and
- a plurality of light source units each including an LED substrate on which a plurality of LED elements are mounted,
- a first main surface of the LED substrate fails to be parallel to a second main surface of the workpiece placed on the supporter, and
- each of the plurality of light source units are arranged to satisfy the following Formula (1)

$$2 \tan 2\theta / \cos \theta \geq D2/D1 \tag{1}$$

where θ is an angle formed by the first main surface and the second main surface, D1 is a separation distance between a first LED element and the workpiece, D2 is a separation distance between the first LED element and a second LED element, the first LED element being mounted on the LED substrate and closest to the second main surface in a normal direction of the second main surface, and the second LED element being mounted on the LED substrate and farthest to the second main surface in the normal direction thereof.

In the present specification, the separation distance D1 between the LED element in the light source unit and the workpiece is defined as the separation distance between the center of the LED element on its light-emitting surface and the workpiece.

In the present specification, the separation distance between the first LED element and the second LED element is defined as the distance between the centers of each of the LED elements when viewed from a direction orthogonal to the first main surface of the substrate. In the case in which one light source unit has the plurality of LED elements applicable as the first LED element, and the plurality of LED elements applicable as the second LED element, the separation distance D2 corresponds to the shortest separation distance among the separation distances of each of the combinations of the first LED element and the second LED element.

The above configuration enables a principal ray of light emitted from the LED elements mounted in the light source unit and located at least closer to the second LED element than to the first LED element to travel outside an area where the LED elements are located on the substrate of the light source unit or outside the light source unit when the light is reflected on the second main surface of the workpiece.

Hence, this configuration reduces the amount of light that is emitted from the LED elements of the light source unit, reflected on the second main surface of the workpiece and returned to the LED elements or the vicinity thereof. In this way, this configuration suppresses the LED elements in the light source unit from being heated by the light reflected from the second main surface of the workpiece. The term "principal ray" refers to as a ray that exhibits the highest intensity in the light emitted from the light source.

The relationship between the derivation of the above Formula (1) and the effect of the above configuration will be described in detail in the section of "DETAILED DESCRIPTION OF THE EMBODIMENTS" with reference to drawings and the like.

The optical heating apparatus may include an angle adjustment mechanism that adjusts the angle θ by changing a position of the LED substrate.

Furthermore, the optical heating apparatus may include a control section that determines a value of the angle θ based on the separation distance D1 and the separation distance D2, and that drives the angle adjustment mechanism based on the value of the angle θ that has been determined.

The above configuration allows the angle θ formed by the first main surface and the second main surface to be suitably adjusted in accordance with a setting of the shape of the workpiece and the separation distance D1 in the heating treatment of the workpiece.

In addition, the above configuration allows the above optical heating apparatus to be configured such that the control section determines the angle θ that satisfies the conditions of the above Formula (1) based on predetermined values of the separation distance D1 and the separation distance D2, for example, and automatically adjusts the position of the LED substrate at the optimum position.

A method of determining the angle θ is, for example, to store a table that has been created by calculating the optimum values of the angle θ with respect to the combinations of the separation distance D1 and the separation distance D2 in advance, and to select the value of the angle θ from the table when the separation distance D1 and the separation distance D2 are input.

The optical heating apparatus may include an angle sensor that measures the angle θ formed by the first main surface and the second main surface.

The above configuration allows the optical heating apparatus to adjust the position of the light source unit or the like while checking whether the placement position of the light source unit satisfies the conditions of the above Formula (1).

In addition, the above configuration enables the detection of a status in which the above Formula (1) fails to become unsatisfied when the light source unit has been out of position by a large impact applied to the optical heating apparatus.

In the optical heating apparatus, the supporter may include a rotation mechanism that rotates the workpiece around an axis orthogonal to the second main surface and passing through the center of the second main surface as a rotation axis.

The above configuration enables the optical heating apparatus to irradiate the workpiece with light for heating emitted from the light source unit while rotating the workpiece placed on the supporter. By irradiating the workpiece with the light for heating while rotating the workpiece, the amount of light irradiated onto the second main surface of the workpiece is equalized in a circumferential direction on the second main surface. Therefore, uneven heating of the workpiece is suppressed.

In the optical heating apparatus, the plurality of LED elements mounted on the LED substrate may emit light having a peak wavelength in a range of 300 nm to 1000 nm.

In particular, a semiconductor wafer made of silicon (Si) (hereinafter referred to as "silicon wafer") exhibits characteristics in which its absorptance is high on light having a wavelength range from ultraviolet light to visible light, but decreases sharply when the wavelength is longer than 1100 nm. As shown in FIG. 4, which is referred to in the description of "DETAILED DESCRIPTION OF THE EMBODIMENTS", the absorptance becomes approximately 50% or less when a silicon wafer are irradiated with light having a wavelength of 1100 nm or more.

As mentioned above, most objects do not absorb all of the light irradiated onto them; however they absorb a part of the light and reflect the other part of the light. In other words, with reference to the graph shown in FIG. 4, 50% or more of the irradiated light is transmitted or reflected without being absorbed when a silicon wafer is irradiated with light having a wavelength of 1100 nm.

When the workpiece has a high reflectance to the irradiated light, the amount of light reflected on the second main surface of the workpiece increases. Hence, the light emitted from the LED elements preferably has a peak wavelength of 1000 nm or less, at which the silicon wafer has an absorptance of 50% or more.

In addition, the silicon wafer exhibits that its absorptance decreases to approximately 10% at the lowest point for light having a wavelength of less than 300 nm. Hence, the light emitted from the LED elements preferably has a peak wavelength of 300 nm or more to ensure its absorptance of at least 25% or more.

Hence, by employing the LED elements in the light source unit that have a peak wavelength in the above wavelength range, this makes it possible to reduce a ratio of the light reflected on the second main surface of the workpiece to the light emitted from the light source unit and irradiated onto the workpiece. Therefore, this configuration suppresses the LED elements mounted in the light source unit from being heated by the reflected light.

Furthermore, in the optical heating apparatus, the plurality of LED elements mounted on the LED substrate emit light having a peak wavelength in a range of 800 nm to 900 nm.

As shown in FIG. 4, silicon (Si) has a small variation in absorptance with respect to variations in wavelength in a wavelength range of 800 nm to 900 nm. Hence, when light in this wavelength range is used to irradiate a silicon wafer, uneven heating is less likely to occur, even if the light irradiated onto each of the irradiated areas in the silicon wafer has a slightly different wavelength.

Therefore, the above configuration enables the optical heating apparatus to be configured to be less affected by a variation in the peak wavelength of the light emitted from the LED elements in the heating treatment of silicon wafers.

A heating treatment method according to the present invention includes:

performing heating treatment to a workpiece placed on a supporter by irradiating the workpiece with light emitted from a plurality of light source units each including an LED substrate on which a plurality of LED elements are mounted;

a first main surface of the LED substrate fails to be parallel to a second main surface of the workpiece placed on the supporter, and each of the plurality of light source units is arranged to satisfy the following Formula (1)

$$2 \tan 2\theta / \cos \theta \geq D2/D1 \qquad (1)$$

where θ is an angle formed by the first main surface and the second main surface, D1 is a separation distance between a first LED element and the workpiece, D2 is a separation distance between the first LED element and a second LED element, the first LED element being mounted on the LED substrate and closest to the second main surface in a normal direction of the second main surface, and the second LED element being mounted on the LED substrate and farthest to the second main surface in the normal direction thereof.

The heating treatment method may include determining a value of the angle θ based on the separation distance D1 and the separation distance D2, and changing a position of the LED substrate based on the value of the angle θ that has been determined.

The present invention suppresses the LED elements, which is a light source for heating, from being heated, thereby achieving an optical heating apparatus and a heating treatment method with improved reliability.

DETAILED DESCRIPTION OF THE EMBODIMENTS

Hereinafter, embodiments of an optical heating apparatus and a heating treatment method according to the present invention will now be described with reference to the drawings. It is noted that each of the following drawings related to the optical heating apparatus is merely schematically illustrated. The dimensional ratios and the number of parts on the drawings do not necessarily match the actual dimensional ratios and the actual number of parts.

Figure 1:
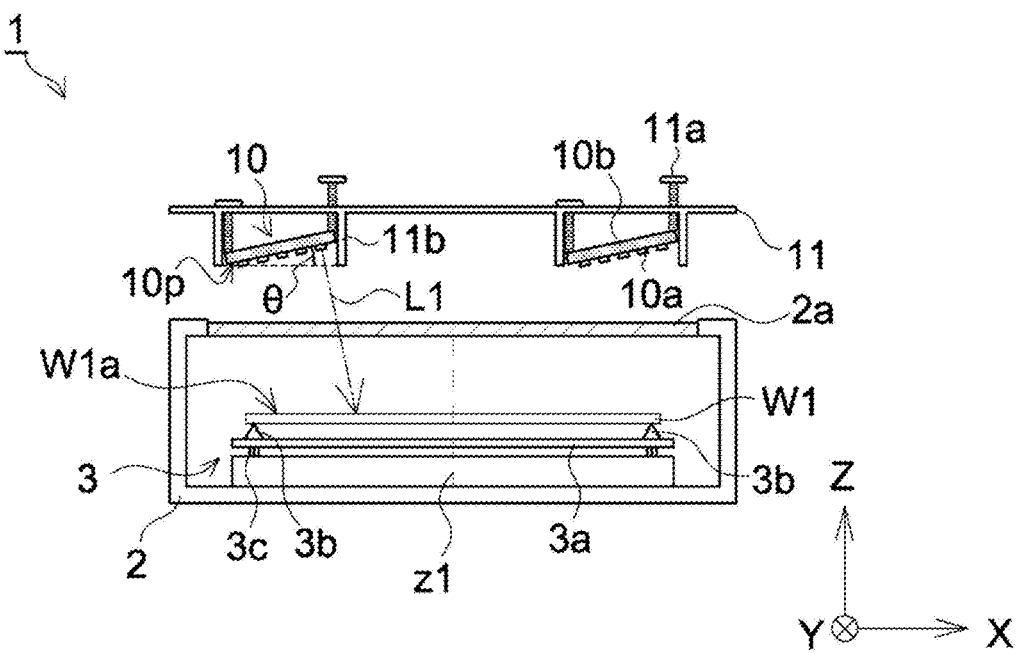
FIG. 1 is a schematic cross-sectional view illustrating an embodiment of an optical heating apparatus when viewed in the Y direction.
Figure 2:
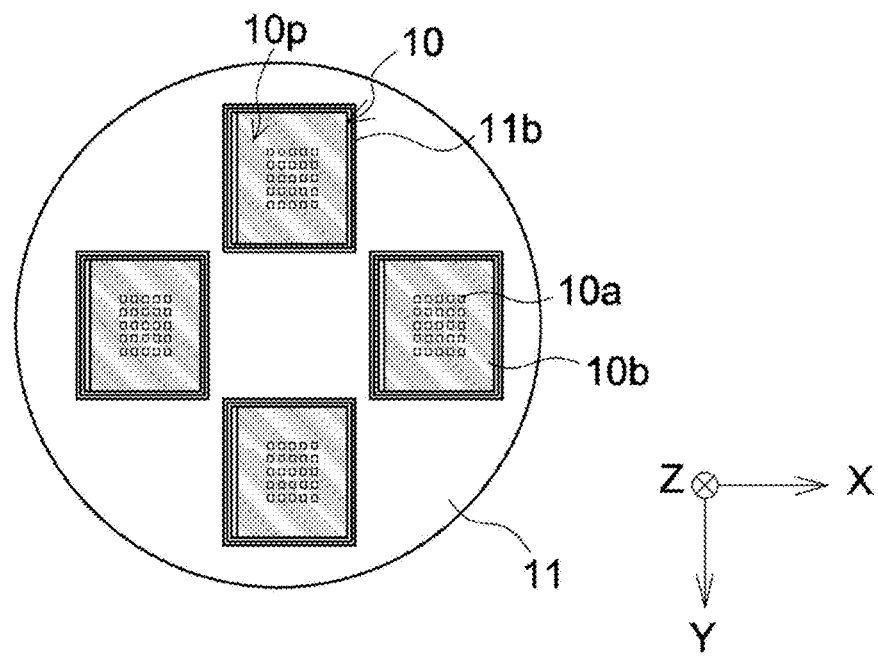
FIG. 2 is a drawing of a frame in FIG. 1 when viewed from the −Z side.
Figure 3:
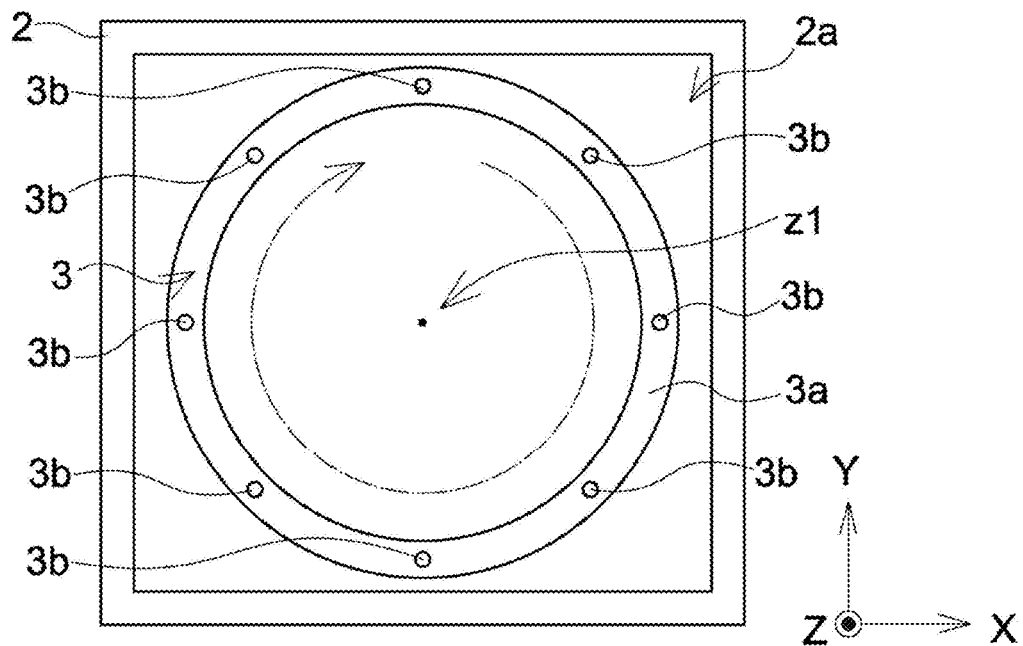
FIG. 3 is a drawing of a chamber in FIG. 1 when viewed from the +Z side.

FIG. 1 is a schematic cross-sectional view illustrating a first embodiment of an optical heating apparatus 1 when viewed in the Y direction. FIG. 2 is a drawing of a frame 11 in FIG. 1 when viewed from the −Z side. FIG. 3 is a drawing of a chamber 2 in FIG. 1 when viewed from the +Z side. As shown in FIG. 1, the optical heating apparatus 1 includes a chamber 2, light source units 10, and a frame 11. In FIG. 3, a light-transmissive window 2a, which will be described later, is not hatched to allow the structure inside the chamber 2 to be seen.

In the following description, a plane parallel to a second main surface W1a of a workpiece W1, which is a heating treatment target and is accommodated in the chamber 2, is defined as the XY plane as shown in FIG. 3; a direction perpendicular to the XY plane is defined as the Z direction as shown in FIG. 1.

When the direction is expressed, a positive or negative sign is assigned to distinguish a positive direction from a negative direction, such as "+Z direction" and "−Z direction". In the case of expressing the direction without distinguishing a positive direction from a negative direction, it is simply expressed as "Z direction".

In addition, in the description of the first embodiment, the workpiece W1 is assumed to be a silicon wafer; however, the optical heating apparatus 1 of the present invention is also assumed to be used for the heating treatment of the workpiece W1 other than the silicon wafer (e.g., glass substrate, etc.).

As shown in FIG. 1, the chamber 2 is provided with a supporter 3 for placing the workpiece W1 inside the chamber 2 and a light-transmissive window 2a for guiding light emitted from the light source units 10 to the inside of the chamber 2.

As shown in FIGS. 1 and 3, the supporter 3 is structured to have a plurality of protrusions 3b on a base 3a, and supports the workpiece W1 on tips of the protrusions 3b.

The supporter 3 of the present embodiment, as shown in FIG. 1, has a rotation mechanism with a plurality of rollers 3c. As shown in FIG. 3, the rotation mechanism allows the workpiece W1, which is placed on the XY plane, to rotate around an axis z1 passing through the center of the supporter 3 in the Z direction as a rotation axis when heating treatment is performed. When the light source units 10 are configured to uniformly irradiate the second main surface W1a of the workpiece W1 with light in a circumferential direction, the supporter 3 may not be necessarily configured to rotate the workpiece W1.

As shown in FIG. 1, the light source unit 10 includes a plurality of LED elements 10a that emit light for heating, and LED substrates 10b on each of which the plurality of LED elements 10a are arranged. In FIG. 1, only principal ray L1 is schematically illustrated among light emitted from the LED elements 10a.

In the light source unit 10, the LED elements 10a that emit infrared light having a peak wavelength of 850 nm are arranged in the X direction and the Y direction on a first main surface 10p of the LED substrate 10b.

In the present embodiment, as shown in FIG. 2, the first main surface 10p of the LED substrate 10b is configured to have a rectangular shape; however, the LED substrate 10b may be any shape. In addition, the LED elements 10a on the LED substrate 10b are not necessarily to be arranged in the X direction or the Y direction; the LED elements 10a on the LED substrate 10b may be suitably arranged in accordance with an expected temperature distribution of the workpiece W1 during heating treatment.

Figure 4:
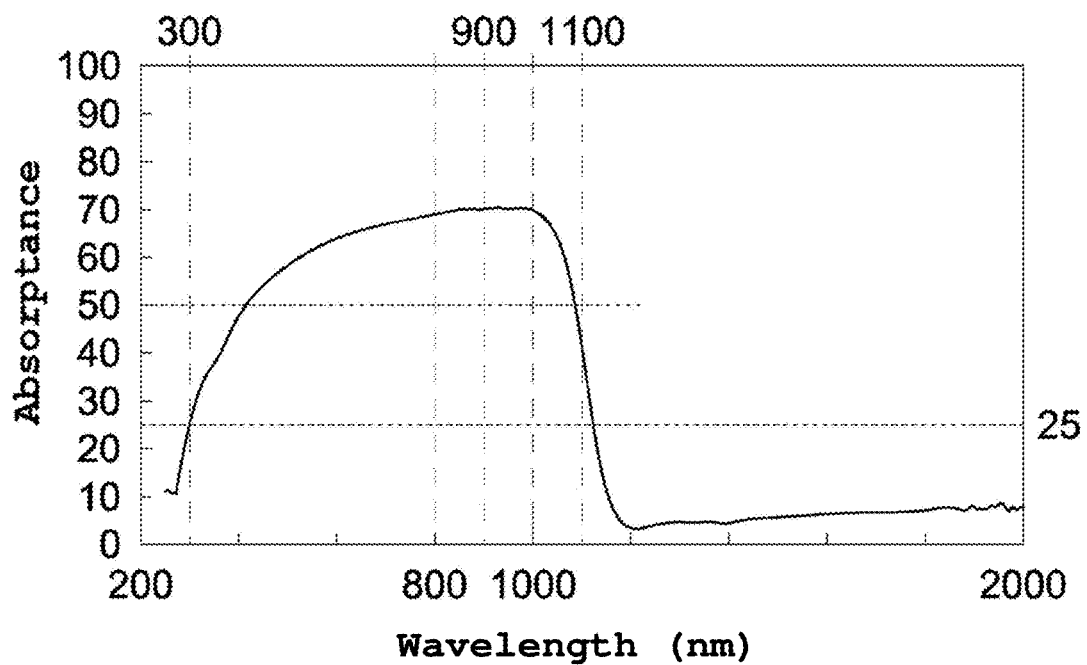
FIG. 4 is a graph illustrating a relationship between the wavelength of light and the absorptance of silicon (Si) at a temperature of 543 K.

FIG. 4 is a graph illustrating a relationship between the wavelength of light and the absorptance of silicon (Si) at a temperature of 543 K. The light emitted from the LED elements 10a can be set to have any peak wavelength; however, as shown in FIG. 4, the light may preferably have a peak wavelength in a range of 300 nm to 1000 nm, and more preferably a peak wavelength in a range of 350 nm to 950 nm in a viewpoint that the absorptance is at least 25% or more, in other words, the reflectance is at least 75% or less.

Furthermore, as shown in FIG. 4, silicon (Si) exhibits a small variation in absorptance with respect to variation in wavelength for light having a wavelength in a range of 800 nm to 900 nm. Hence, in the viewpoint of suppressing uneven heating, light emitted from the LED elements 10a mounted in the light source units 10 preferably has a peak wavelength in a range of 800 nm to 900 nm, and more preferably a peak wavelength in a range of 820 nm to 880 nm.

As shown in FIG. 1, the frame 11 in the present embodiment is provided with adjustment screws 11a as an angle adjustment mechanism to adjust the angle θ of the tilt of the light source unit 10, thus changing the emission direction of the light emitted from the LED elements 10a. The frame 11 is also provided with support walls 11b to prevent the position of the light source unit 10 from being shifted during the adjustment of the tilt thereof.

The frame 11 may be configured to fix the light source unit 10 at a predetermined angle θ without being provided with the adjustment screws 11a and the support walls 11b. The angle adjustment mechanism may employ, for example, a mechanism such as a piezo actuator or a micrometer head with an encoder.

The frame 11 in the present embodiment is a member that supports the plurality of light source units 10. As shown in FIG. 1, the frame 11 is adjusted by the adjustment screws 11a to tilt the first main surface 10p of the LED substrate 10b provided in the light source unit 10 to the angle θ with respect to the XY plane.

As shown in FIG. 1, the frame 11 in the present embodiment allows the light source unit 10 to be tilted to the angle θ by rotating the LED substrate 10b around the Y axis as an rotation axis, from the state in which the first main surface 10p of the LED substrate 10b is aligned with the XY plane; however any axis may be selected as the rotation axis as long as the axis is parallel to the XY plane.

Hereinafter, the conditions for the angle θ will be explained.

Figure 5:
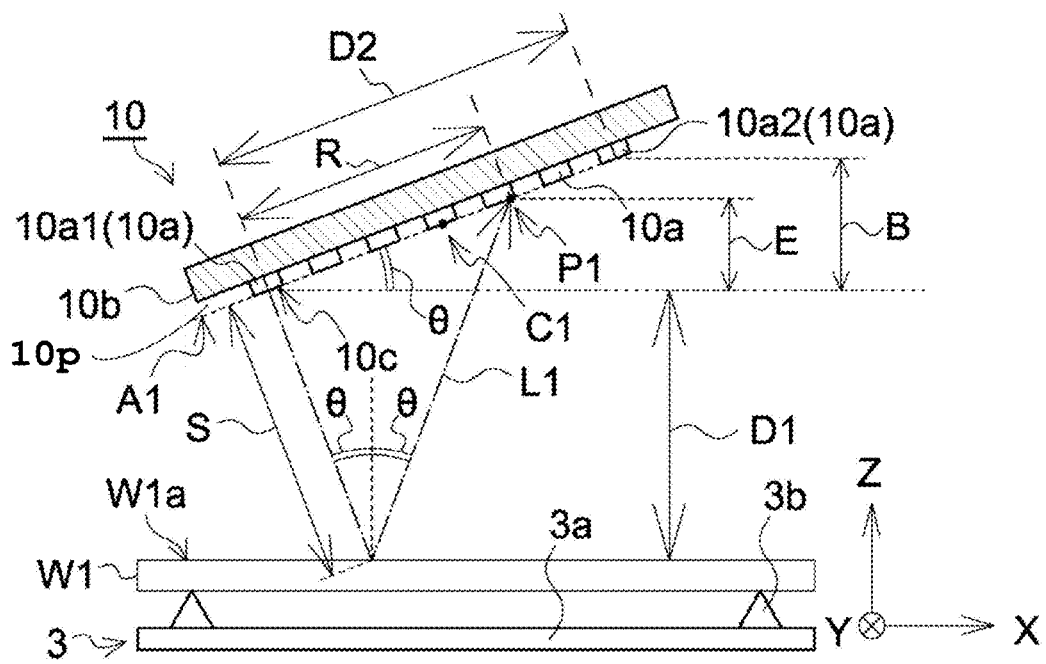
FIG. 5 is a schematic drawing that explains a configuration of a light source unit and a relationship between the light source unit and a workpiece.

FIG. 5 is a schematic drawing that explains a configuration of the light source unit 10 and a relationship between the light source unit 10 and the workpiece W1. For convenience of explanation, the configuration shown in FIG. 5 is illustrated differently compared with that in FIG. 1 in terms of the angle θ formed by the first main surface 10p and the second main surface W1a, the number of LED elements 10a mounted in the light source unit 10 and the size ratio of the light source unit 10 to the workpiece W1.

The light source unit 10 is disposed to satisfy Formula (1) described above. Formula (1) is restated here.

$$2 \tan 2\theta / \cos \theta \geq D2/D1 \tag{1}$$

where θ is an angle formed by the first main surface 10p and the second main surface W1a, D1 is a separation distance between a first LED element 10a1 and the workpiece W1, D2 is a separation distance between the first LED element 10a1 and a second LED element 10a2, the first LED element 10a1 being mounted on the LED substrate 10b and closest to the second main surface W1a in a normal direction of the second main surface W1a, and the second LED element 10a2 being mounted on the LED substrate 10b and farthest to the second main surface W1a in the normal direction thereof.

Specifically, the light source unit 10 in the present embodiment is configured to have the angle θ of 20.6°, the separation distance D1 of 40 mm and the separation distance D2 of 16 mm.

Hereinafter, the process of deriving the above Formula (1) will be explained. The principal ray L1 is assumed to be normally reflected and not to be absorbed by the second main surface W1a of the workpiece W1 in the following explanation.

First, as shown in FIG. 5, when the principal ray L1 of light emitted from the first LED element 10a1 is reflected on the second main surface W1a of the workpiece W1, a point at which the principal ray L1 intersects with a surface A1 extending light-emitting surfaces 10c of the LED elements 10a is defined as P1. R is a separation distance between the center of the light-emitting surface 10c of the first LED element 10a1 and the point P1, and E is a distance between the center thereof and the point P1 in the Z direction. Furthermore, B is a distance between the first LED element 10a1 and the second LED element 10a2 in the Z direction.

As shown in FIG. 5, the principal ray L1 of light emitted from the first LED element 10a1 travels toward the workpiece W1 side (in −Z direction) and reaches the second main surface W1a. Here, S is a distance that the principal ray L1 travels from a point at which the principal ray L1 is emitted from the first LED element 10a1 to a point at which the principal ray L1 reaches the second main surface W1a.

The principal ray L1 is incident on the second main surface W1a at an angle of incidence θ and is reflected at an angle of reflection θ. The principal ray L1 then travels toward the light source unit 10 side (+Z direction) and eventually reaches the point P1.

Among the plurality of LED elements 10a, the first LED element 10a1 has the shortest travel distance S of its principal ray L1. The LED element 10a closer to the second LED element 10a2 has a longer travel distance S. In other words, when viewed in the X direction, the LED element 10a closer to the second LED element 10a2 has a longer travel distance of the principal ray L1 in +X direction when the principal ray L1 is emitted from the LED element 10a, is reflected on the second main surface W1a and reaches the surface A1.

Based on the above relationship, when the point P1, at which the principal ray L1 emitted from the first LED element 10a1 arrives, is located on the side of the second LED element 10a2 with respect to a midpoint C1 that defines a point between the first LED element 10a1 and the second LED element 10a2, the principal ray L1 of the light emitted from the LED element 10a closer to the second LED element 10a2 than to the first LED element 10a1 reaches at least the area on the LED substrate 10b where the LED elements 10a fail to be located, as mentioned above. In other words, the configuration enables half or more of the light emitted from the LED elements 10a and reflected on the second main surface W1a of the LED substrate 10b to travel to outside the LED substrate 10b, thereby suppressing the LED elements 10a from being heated by the light reflected on the second main surface W1a.

The following Formula (2) specifies the condition in which the point P1 is located on the side of the second LED element 10a2 with respect to the midpoint C1, which is defined as a point between the first LED element 10a1 and the second LED element 10a2.

$$2E \geq B \quad (2)$$

As shown in FIG. 5, the relationship between the distance E, the distance R and the angle θ is expressed by E=R×sin θ. Similarly, the relationship among the distance B, the separation distance D2 and the angle θ is expressed as B=D2×sin θ. The above Formula (2) described above becomes Formula (3) described below when these equations of the relationship are substituted to the above Formula (2) and organized.

$$2R \geq D2 \quad (3)$$

Furthermore, as shown in FIG. 5, the relationship among the distance R, the travel distance S and the angle θ is expressed as R=S×tan 2θ. The above Formula (3) becomes Formula (4) described below when the equation of the relationship is substituted to the above Formula (3).

$$2(S \times \tan 2\theta) \geq D2 \quad (4)$$

Finally, as shown in FIG. 5, the relationship among the travel distance S, the separation distance D1, and the angle θ is expressed as the equation of S=D1/cos θ, thereby the above Formula (4) becomes the above Formula (1) when the equation of the relationship are substituted to Formula (4) and organized.

With the above configuration, the principal ray L1 of the light emitted from the LED element 10a that is at least disposed closer to the second LED element 10a2 than to the first LED element 10a1, among the LED elements 10a mounted in the light source unit 10, will travel to outside the area where the LED elements 10a are located on the LED substrate 10b of the light source unit 10 or outside the light source unit 10 when reflected on the second main surface W1a of the workpiece W1.

Hence, this configuration reduces the amount of light that is emitted from the LED elements 10a of the light source unit 10, reflected on the second main surface W1a of the workpiece W1 and returned to the LED elements 10a again. Therefore, this configuration suppresses the LED elements 10a mounted in the light source unit 10 from being heated by the light reflected on the second main surface W1a of the workpiece W1.

The angle θ of the optical heating apparatus 1 is calculated by measuring the tilt of the second main surface W1a of the workpiece W1 and the tilt of the first main surface 10p of the LED substrate 10b using a level, and comparing both of the tilts. The angle θ of the optical heating apparatus 1 may also be calculated by measuring the distance between the first LED element 10a1 and the second main surface W1a of the workpiece W1, the distance between the second LED element 10a2 and the second main surface W1a of the workpiece W1 and the distance between the first LED element 10a1 and the second LED element 10a2.

Another Embodiment

Hereinafter another embodiment will be described.

Figure 6:
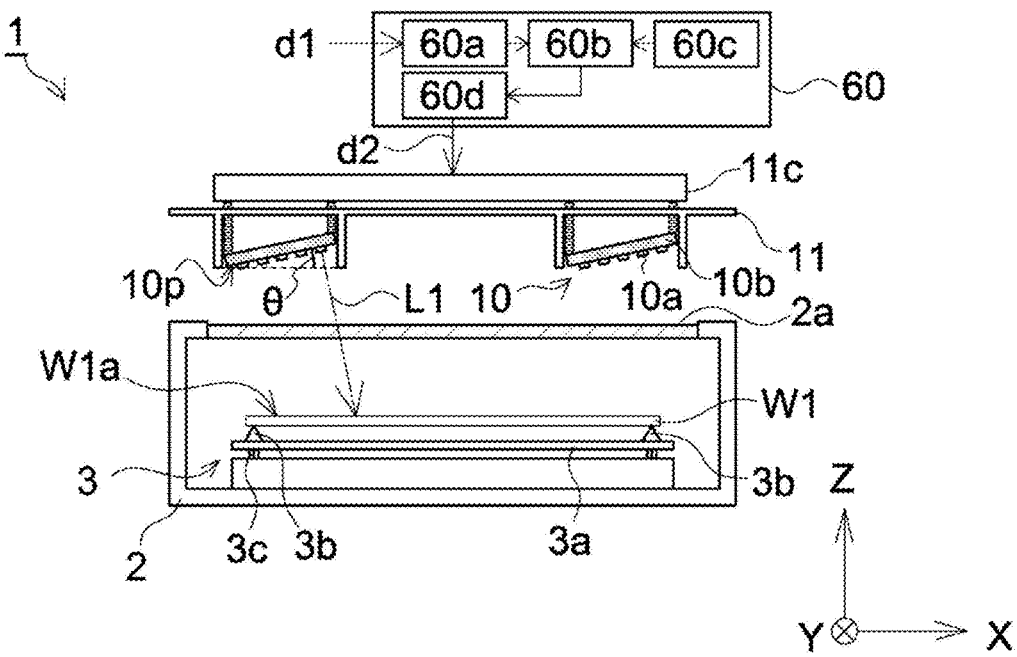
FIG. 6 is a schematic cross-sectional view of another embodiment of the optical heating apparatus when viewed in the Y direction.

<1> FIG. 6 is a schematic cross-sectional view of another embodiment of the optical heating apparatus 1 when viewed in the Y direction. As shown in FIG. 6, another embodiment of the optical heating apparatus 1 includes a control section 60 and a drive mechanism 1ic that is an angle adjustment mechanism for changing the position of LED substrate 10b based on a drive signal d2 output from the control section 60. The control section 60 in the present embodiment includes an input section 60a, a memory section 60b, a judgment section 60c, and an output section 60d.

The input section 60a receives an input of data d1 containing information on the values of the separation distance D1 and the separation distance D2. The memory section 60b stores a table of the values of angle θ satisfying Formula (1), the table corresponding to the combinations of the separation distance D1 and the separation distance D2. The judgment section 60c determines the value of the angle θ based on the values of the respective separation distances (D1, D2) input to the input section 60a and the table stored in the memory section 60b. The output section 60d outputs the drive signal d2 to the drive mechanism 11c to make a value of the angle θ formed by the first main surface 10p of the LED substrate 10b and the second main surface W1a of the workpiece W1 to be the value of the angle θ determined by the judgment section 60c.

In the optical heating apparatus 1, the above configuration allows the control section 60 to determine the angle θ that satisfies the condition of the above Formula (1) based on the predetermined values of separation distance D1 and separation distance D2, thus automatically adjusting the position of the LED substrate 10b to the optimal position.

<2> The optical heating apparatus 1 may include an angle sensor for measuring the angle θ formed by the first main surface 10p and the second main surface W1a. The optical heating apparatus 1 provided with such an angle sensor is capable of adjusting the placement position of the light source unit 10 while checking whether the placement position of the light source unit 10 satisfies the conditions of the above Formula (1).

The optical heating apparatus 1 of the present invention may be configured to detect a status in which the light source unit 10 no longer satisfies the condition of the above Formula (1) and provide an alert when the light source unit 10 has been out of position by a large impact applied to the optical heating apparatus 1.

Examples of the angle sensor for the optical heating apparatus 1 in the present embodiment may include a rotary potentiometer or a rotary encoder.

<3> The configurations provided in the optical heating apparatus 1 described above are merely examples, and the present invention is not limited to each of the configurations shown in the figures.

What is claimed is:

1. An optical heating apparatus that performs heating treatment to a workpiece by irradiating the workpiece with light, the optical heating apparatus comprising:
   a supporter on which the workpiece is placed;
   a plurality of light source units located at a first predetermined distance from the workpiece and each of the light source units including an LED substrate on which a plurality of LED elements are mounted over a second predetermined distance along the LED substrate, the LED elements emitting light towards the workpiece and the workpiece reflecting the emitted light to cause reflected light, each of the LED substrates being placed at a predetermined angle with respect to the workpiece; and
   at least a predetermined space being provided between two adjacent ones of the light source units, wherein the first predetermined distance, the second predetermined distance and the predetermined angle cause at least a half of the reflected light to travel into the predetermined space between the LED substrates, wherein a first main surface of the LED substrate fails to be parallel to a second main surface of the workpiece placed on the supporter, each of the plurality of the light source units is arranged to satisfy the following Formula (1)

$$2\tan 2\theta/\cos\theta \geq D2/D1 \quad (1)$$

where θ is the predetermined angle formed by the first main surface and the second main surface, D1 is the first predetermined distance between a first one of the LED elements and the workpiece, D2 is the second predetermined distance between the first one of the LED elements and a second one of the LED elements, the first one of the LED elements being mounted on the LED substrate and closest to the second main surface in a normal direction of the second main surface, and the second one of the LED elements being mounted on the LED substrate and farthest to the second main surface in the normal direction thereof.

2. The optical heating apparatus according to claim 1, further comprising an angle adjustment mechanism that adjusts the predetermined angle by changing a position of the LED substrate.

3. The optical heating apparatus according to claim 2, further comprising a control section that determines a value of the predetermined angle based on the predetermined distance and the predetermined distance, and that drives the angle adjustment mechanism based on the value of the predetermined angle that has been determined.

4. The optical heating apparatus according to claim 2, further comprising an angle sensor that measures the predetermined angle.

5. The optical heating apparatus according to claim 2, wherein the supporter includes a rotation mechanism that rotates the workpiece around an axis orthogonal to the workpiece and passing through the center of the workpiece as a rotation axis.

6. The optical heating apparatus according to claim 2, wherein the plurality of LED elements mounted on the LED substrate emit light having a peak wavelength in a range of 300 nm to 1000 nm.

7. The optical heating apparatus according to claim 6, wherein the plurality of LED elements mounted on the LED substrate emit light having a peak wavelength in a range of 800 nm to 900 nm.

8. The optical heating apparatus according to claim 1, further comprising an angle sensor that measures the predetermined angle.

9. The optical heating apparatus according to claim 1, wherein the supporter includes a rotation mechanism that rotates the workpiece around an axis orthogonal to the workpiece and passing through the center of the workpiece as a rotation axis.

10. The optical heating apparatus according to claim 1, wherein the plurality of LED elements mounted on the LED substrate emit light having a peak wavelength in a range of 300 nm to 1000 nm.

11. The optical heating apparatus according to claim 10, wherein the plurality of LED elements mounted on the LED substrate emit light having a peak wavelength in a range of 800 nm to 900 nm.

12. A heating treatment method comprising:
placing a workpiece on a supporter;
placing a plurality of light source units at a predetermined angle with respect to the workpiece and a first predetermined distance from the workpiece, each of the light source units including an LED substrate on which a plurality of LED elements are mounted over a second predetermined distance;
determining a value of the predetermined angle based on the first predetermined distance and the second predetermined distance along the LED substrate, and changing a position of the LED substrate based on the value of the predetermined angle that has been determined;
providing at least a predetermined space between two adjacent ones of the light source units; and
irradiating the workpiece with light emitted from the LED elements towards the workpiece and the workpiece reflecting the emitted light to cause reflected light, wherein the first predetermined distance, the second predetermined distance and the predetermined angle cause at least a half of the reflected light to travel into the predetermined space between the LED substrates.

* * * * *